US012685073B2

(12) United States Patent
Jung et al.

(10) Patent No.: US 12,685,073 B2
(45) Date of Patent: Jul. 14, 2026

(54) AUTO TEACHING APPARATUS INCLUDING TEST SUBSTRATE AND AUTO TEACHING METHOD USING DISTANCE MEASURING SENSOR

(71) Applicant: SEMES CO., LTD., Chungcheongnam-do (KR)

(72) Inventors: Sung Hyuk Jung, Chungcheongnam-do (KR); Jin Woo Sim, Chungcheongnam-do (KR)

(73) Assignee: SEMES CO., LTD., Chungcheongnam-Do (KR)

( * ) Notice: Subject to any disclaimer, the term of this patent is extended or adjusted under 35 U.S.C. 154(b) by 491 days.

(21) Appl. No.: 17/970,209

(22) Filed: Oct. 20, 2022

(65) Prior Publication Data

US 2023/0211495 A1 Jul. 6, 2023

(30) Foreign Application Priority Data

Dec. 30, 2021 (KR) ......................... 10-2021-0193172

(51) Int. Cl.
　　*G01S 17/10* (2020.01)
　　*H10P 72/00* (2026.01)
　　*H10P 72/30* (2026.01)

(52) U.S. Cl.
　　CPC .......... *H10P 72/0606* (2026.01); *G01S 17/10* (2013.01); *H10P 72/0608* (2026.01); *H10P 72/3306* (2026.01)

(58) Field of Classification Search
　　CPC ............... G01S 17/10; H01L 21/67259; H01L 21/67265; H01L 21/67748
　　See application file for complete search history.

(56) References Cited

U.S. PATENT DOCUMENTS 5,444,637 A * 8/1995 Smesny ................ H01L 23/544
　　　　　　　　　　　　　　　　　　　　700/121
2003/0198376 A1* 10/2003 Sadighi .................. B25J 9/1697
　　　　　　　　　　　　　　　　　　　　382/153
(Continued)

FOREIGN PATENT DOCUMENTS

CN　　　　1589975 A　　3/2005
CN　　106098540 A　　11/2016
(Continued)

OTHER PUBLICATIONS

Notice of Reasons for Refusal issued by the Japanese Patent Office on Jan. 23, 2024 in corresponding JP Patent Application No. 2022-180823, with English translation.
(Continued)

*Primary Examiner* — Saul Rodriguez
*Assistant Examiner* — Brendan P Tighe
(74) *Attorney, Agent, or Firm* — Carter, DeLuca & Farrell LLP

(57) ABSTRACT

The present disclosure may provide an auto-teaching method and apparatus using a distance measuring sensor a semiconductor manufacturing facility having a transfer robot including the same, and a substrate processing apparatus including a test substrate according to an embodiment of the present disclosure, may include: a test substrate connected to a robot arm and entering a processing apparatus in a first predetermined direction; a distance measuring sensor connected to the test substrate, and measuring a distance from the processing apparatus in the first direction while scanning the processing apparatus in a predetermined second direction; and a position control unit determining a region in which a substrate may enter the processing apparatus in the second direction, based on predetermined pro-
(Continued)

cessing apparatus-related information and a measured result of the distance measuring sensor.

20 Claims, 6 Drawing Sheets

(56) References Cited

U.S. PATENT DOCUMENTS

| | | | |
|---|---|---|---|
| 2003/0202092 A1* | 10/2003 | Sadighi | B25J 9/1697 |
| | | | 348/87 |
| 2004/0018745 A1* | 1/2004 | Tashiro | H01L 21/68 |
| | | | 438/758 |
| 2015/0108376 A1 | 4/2015 | Kawaguchi | |
| 2016/0320716 A1 | 11/2016 | Hosaka | |
| 2018/0350644 A1 | 12/2018 | Matsuura | |
| 2020/0075367 A1* | 3/2020 | Potter | H01L 21/681 |
| 2020/0075370 A1* | 3/2020 | Potter | B25J 9/1692 |
| 2021/0074567 A1* | 3/2021 | Safrani | H01L 21/67259 |
| 2021/0252694 A1 | 8/2021 | Toyomaki | |
| 2021/0252695 A1 | 8/2021 | Shindo | |
| 2022/0319887 A1* | 10/2022 | Potter | B25J 13/086 |
| 2022/0392791 A1 | 12/2022 | Yamamoto et al. | |

FOREIGN PATENT DOCUMENTS

| | | | |
|---|---|---|---|
| CN | 109003931 | A | 12/2018 |
| JP | H11-026543 | A | 1/1999 |
| JP | 2000-232145 | A | 8/2000 |
| JP | 2015-078946 | A | 4/2015 |
| JP | 2020-096079 | A | 6/2020 |
| JP | 2021-536121 | A | 12/2021 |
| JP | 2022-187931 | A | 12/2022 |
| KR | 10-2004-0022649 | A | 3/2004 |
| KR | 10-2006-0062020 | A | 6/2006 |
| KR | 10-2009-0051423 | A | 5/2009 |
| KR | 10-2010-0068816 | A | 6/2010 |
| KR | 10-2139612 | B1 | 7/2020 |
| KR | 10-2021-0070505 | A | 6/2021 |
| KR | 10-2021-0103404 | A | 8/2021 |
| WO | 2020/051001 | A1 | 3/2020 |

OTHER PUBLICATIONS

Office Action issued by the Korean Intellectual Property Office on Jul. 18, 2023 in corresponding KR Patent Application No. 10-2021-0193172, with English translation.

Chinese Office Action issued by the China National Intellectual Property Administration on May 27, 2026 in corresponding CN Patent Application No. 202211576219.7, with English translation.

* cited by examiner

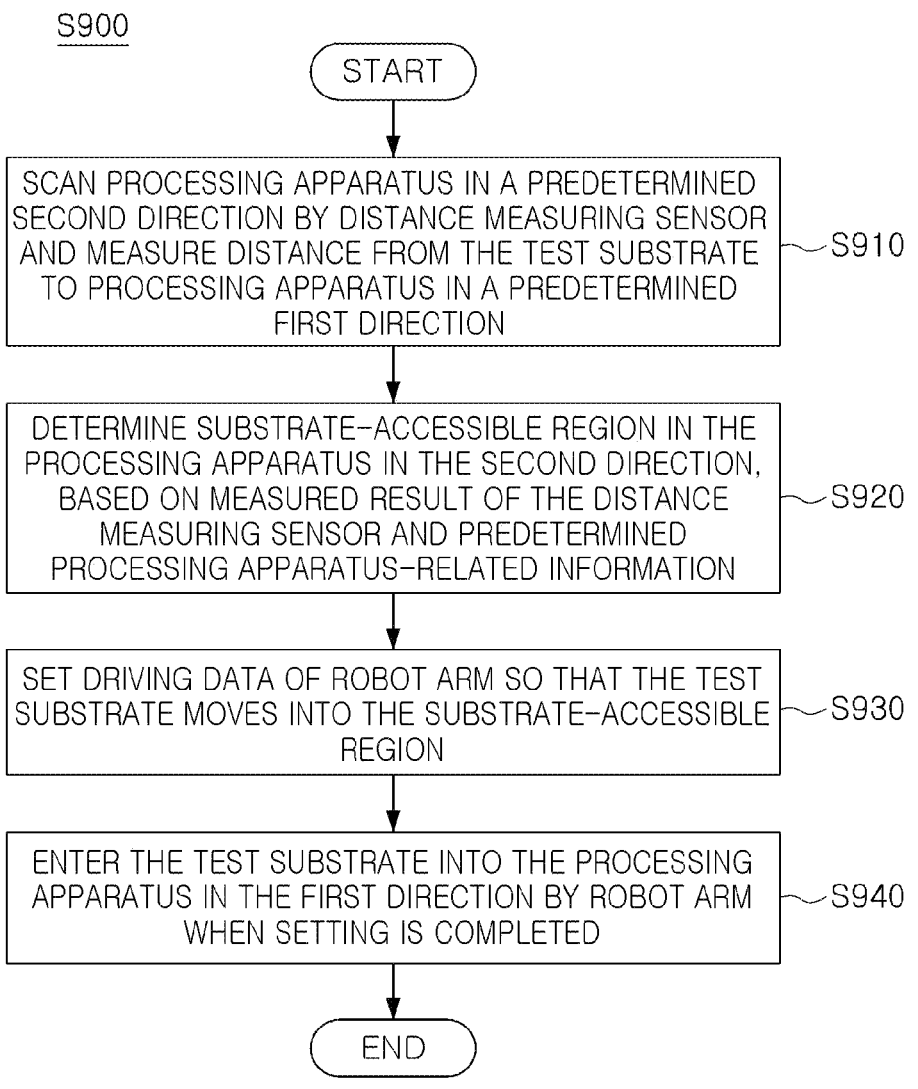

S900

START

SCAN PROCESSING APPARATUS IN A PREDETERMINED
SECOND DIRECTION BY DISTANCE MEASURING SENSOR
AND MEASURE DISTANCE FROM THE TEST SUBSTRATE    ~S910
TO PROCESSING APPARATUS IN A PREDETERMINED
FIRST DIRECTION

DETERMINE SUBSTRATE-ACCESSIBLE REGION IN THE
PROCESSING APPARATUS IN THE SECOND DIRECTION,
BASED ON MEASURED RESULT OF THE DISTANCE    ~S920
MEASURING SENSOR AND PREDETERMINED
PROCESSING APPARATUS-RELATED INFORMATION

SET DRIVING DATA OF ROBOT ARM SO THAT THE TEST
SUBSTRATE MOVES INTO THE SUBSTRATE-ACCESSIBLE    ~S930
REGION

ENTER THE TEST SUBSTRATE INTO THE PROCESSING
APPARATUS IN THE FIRST DIRECTION BY ROBOT ARM    ~S940
WHEN SETTING IS COMPLETED

END

FIG. 9

AUTO TEACHING APPARATUS INCLUDING TEST SUBSTRATE AND AUTO TEACHING METHOD USING DISTANCE MEASURING SENSOR

CROSS-REFERENCE TO RELATED APPLICATION(S)

This application claims the benefit under 35 USC 119(a) of Korean Patent Application No. 10-2021-0193172 filed on Dec. 30, 2021 in the Korean Intellectual Property Office, the entire disclosure of which is incorporated herein by reference for all purposes.

BACKGROUND

The present disclosure relates to a substrate processing apparatus including a test substrate and an auto-teaching method using a distance measuring sensor.

In a semiconductor manufacturing apparatus, a wafer W repeats transfer to perform various processes, and repeats entry into and exit from various chambers such as a process chamber, a vacuum chamber, and the like.

In particular, in the case of the vacuum chamber, since an inside of a space thereof is sealed, it is difficult to determine whether the wafer W has entered from the outside, and it is not easy to physically install a separate camera therein. Therefore, since it is difficult to determine whether the wafer is well accommodated and mounted in the vacuum chamber, an user has to be aware of the possibility of collision of the wafer, and manually determine whether there is an obstacle when inserting the wafer into the chamber.

Due thereto, human error may inevitably occur, resulting in an error in a position of the wafer inevitably occurring, and as a result, a wafer yield may be inevitably adversely affected.

In addition, in the prior patent document, a pair of sensor units were installed on an outer wall of the processing apparatus and a transport apparatus to measure a distance according to an amount of light received by a sensor from a light receiving unit, and second position control was performed inside a chamber through a second sensor unit, but this could not be performed if a sensor could not be attached to an outside of the processing unit, because a separate sensor unit had to be installed outside of the processing unit, and only whether a wafer was located in a center could be determined, and position correction in a Z-axis may not be performed.

That is, it was impossible in the prior art to determine whether the position correction and progress in the Z-axis are well performed outside of the chamber or inside of the chamber.

Therefore, there is a need for an apparatus or method that can control whether the wafer enters the chamber without affecting an internal space of the chamber and determine whether the wafer properly enters the chamber.

SUMMARY

In order to solve the problems of the prior art, an aspect of the present disclosure is to provide a substrate processing apparatus including a test substrate and an auto-teaching method using a distance measuring sensor, which can control the position of the substrate, not only outside the processing apparatus but also inside the processing apparatus, which is difficult for a user to visually determine.

According to the present disclosure, a substrate processing apparatus including a test substrate and an auto-teaching method using a distance measuring sensor may be provided.

According to an aspect of the present disclosure, a substrate processing apparatus including a test substrate may include: a test substrate connected to a robot arm and entering a processing apparatus in a first predetermined direction; a distance measuring sensor connected to the test substrate, and measuring a distance from the processing apparatus in the first direction while scanning the processing apparatus in a predetermined second direction; and a position control unit determining a substrate-accessible region of the processing apparatus in the second direction, based on the predetermined processing apparatus-related information and a measurement result of the distance measuring sensor.

According to an aspect of the present disclosure, an auto-teaching method of a robot arm for transferring a test substrate having a distance measuring sensor installed on a front surface thereof according to an embodiment, may include a distance measuring operation, in which the distance measuring sensor scans a processing apparatus in a predetermined second direction, and measures a distance from the test substrate to the processing apparatus in a predetermined first direction; a height calculation operation of determining a substrate-accessible region of the processing apparatus in the second direction, based on a measurement result of the distance measuring sensor and predetermined processing apparatus-related information; and a setting operation of setting driving data of the robot arm so that the test substrate moves into the substrate-accessible region.

In addition, in the present disclosure, a recording medium in which a program performing the method according to an embodiment of the present disclosure is stored may be provided.

BRIEF DESCRIPTION OF DRAWINGS

The above and other aspects, features, and advantages of the present disclosure will be more clearly understood from the following detailed description, taken in conjunction with the accompanying drawings, in which:

FIG. 9 is a flowchart illustrating an auto-teaching method using a distance measuring sensor according to an embodiment of the present disclosure.

DETAILED DESCRIPTION

The following detailed description is provided to assist the reader in gaining a comprehensive understanding of the methods, apparatuses, and/or systems described herein. However, various changes, modifications, and equivalents of the methods, apparatuses, and/or systems described herein will be apparent to one of ordinary skill in the art. The sequences of operations described herein are merely examples, and are not limited to those set forth herein, but may be changed, as will be apparent to one of ordinary skill in the art, with the exception of operations necessarily occurring in a certain order. Also, descriptions of functions and constructions that would be well known to one of ordinary skill in the art may be omitted for increased clarity and conciseness.

The terminology used herein describes particular embodiments only, and the present disclosure is not limited thereby. As used herein, the singular forms "a," "an," and "the" are intended to include the plural forms as well, unless the context clearly indicates otherwise. It will be further understood that the terms "including", "comprises," and/or "comprising" when used in this specification, specify the presence of stated features, integers, steps, operations, members, elements, and/or groups thereof, but do not preclude the presence or addition of one or more other features, integers, steps, operations, members, elements, and/or groups thereof. Hereinafter, exemplary embodiments will be described with reference to various examples. However, embodiments of the present disclosure may be modified in various other forms, and the scope of the present disclosure is not limited to the embodiments described below.

Figure 1:
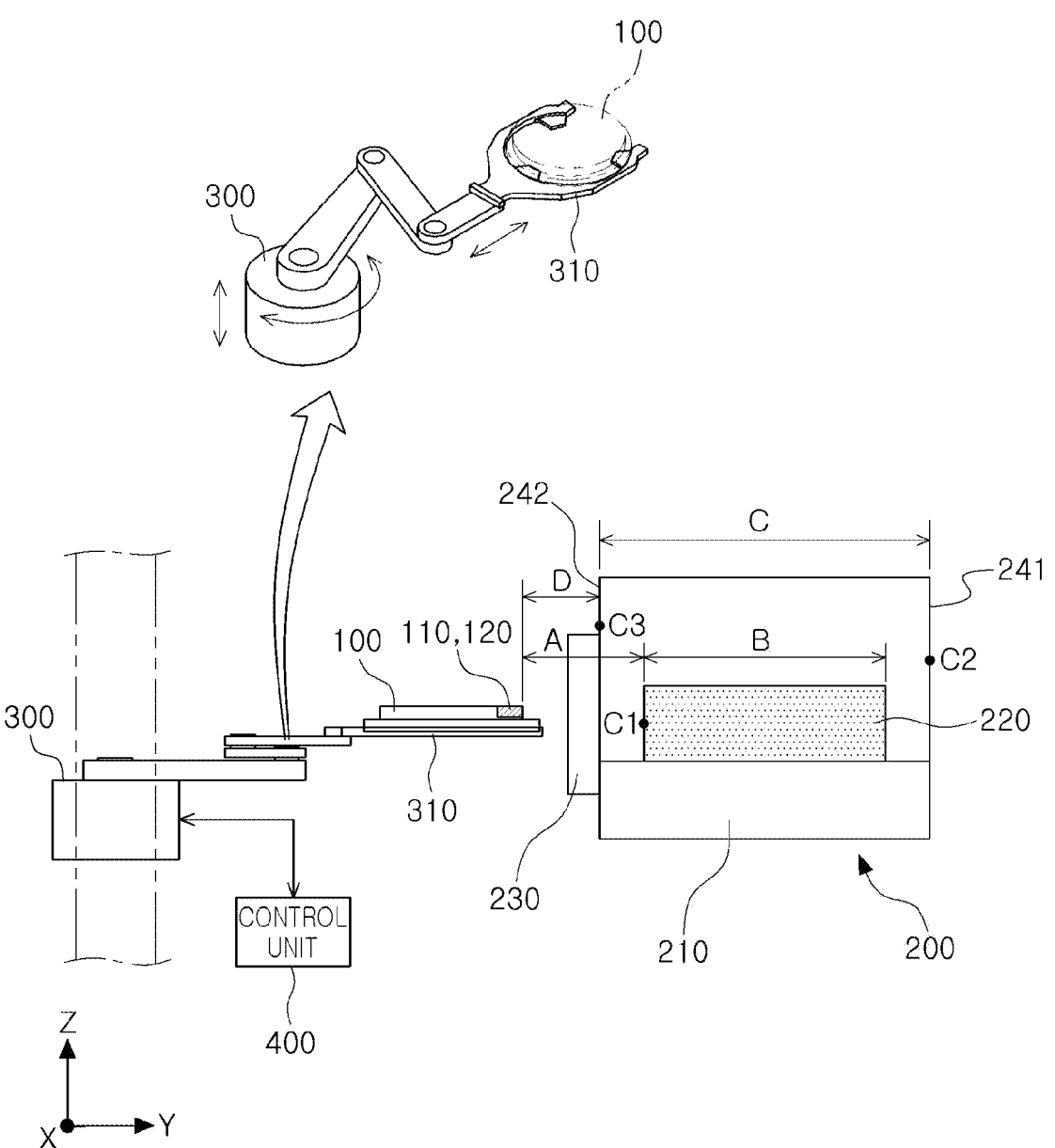
FIG. 1 is a side view of a substrate processing apparatus including a test substrate using a distance measuring sensor according to an embodiment of the present disclosure.
Figure 2A:
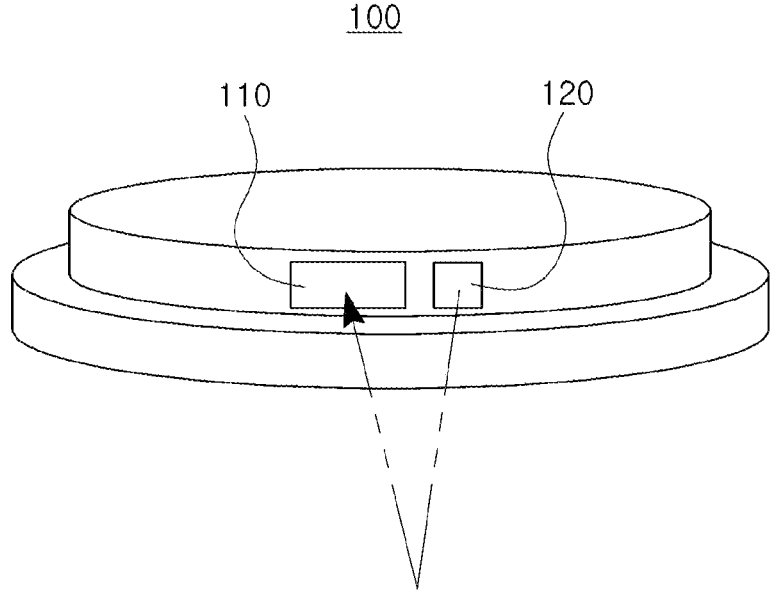
FIG. 2A illustrates a test substrate on which a distance measuring sensor according to an embodiment of the present disclosure is installed.
Figure 2B:
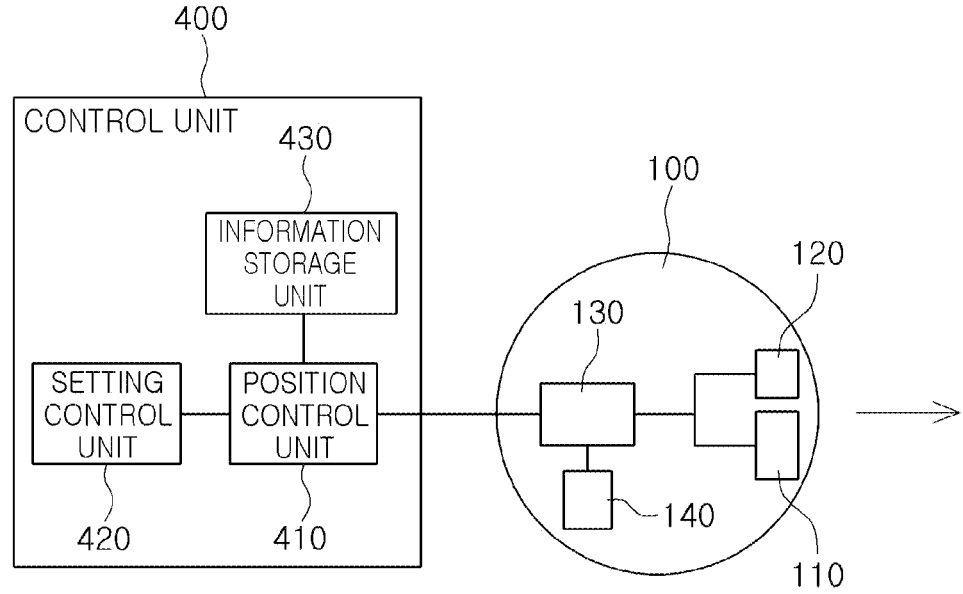
FIG. 2B is a schematic block diagram of a test substrate and a control unit connected thereto according to an embodiment of the present disclosure.

FIG. 1 is a side view of a substrate processing apparatus including a test substrate 100 using distance measuring sensors 110 and 120 according to an embodiment of the present disclosure, FIG. 2A illustrates a test substrate 100 according to an embodiment of the present disclosure, and FIG. 2B schematically illustrates an internal block diagram of a test substrate 100 according to an embodiment of the present disclosure and a control unit 400 connected thereto.

As illustrated in FIGS. 1 and 2A, the substrate processing apparatus may include a test substrate 100 connected to a robot arm 310 and entering a processing apparatus in a predetermined first direction; distance measuring sensors 110 and 120 connected to the test substrate 100, and measuring a distance from the processing apparatus in the first direction while scanning the processing apparatus in a predetermined second direction; and a position control unit 400 determining a substrate-accessible region of the processing apparatus in the second direction, based on predetermined processing apparatus-related information and measurement results of the distance measuring sensors 110 and 120.

Here, the substrate-accessible region of the processing apparatus may mean a substrate entry height based on a predetermined second direction, that is, a Z-axis direction.

The test substrate 100 according to an embodiment of the present disclosure may be a substrate through which a wafer W enters a vacuum chamber 200 in order to confirm and set a position at which the wafer W will enter before the wafer W enters the vacuum chamber 200.

According to an embodiment of the present disclosure, as illustrated in FIG. 1, the processing apparatus may be a vacuum chamber 200. However, it is not limited by the above exemplary embodiment, and the processing apparatus may include at least one of a process chamber, an elevating chamber, a buffer, a load lock, and a load port in addition to the vacuum chamber 200, and may refer to any structure in which sections are divided at regular intervals.

In addition, the first direction may be a predetermined direction, a direction in which the test substrate 100 enters the vacuum chamber 200, and according to an embodiment of the present disclosure, as illustrated in FIG. 1, a Y-axis direction.

Specifically, distance measuring sensors 110 and 120 according to an embodiment of the present disclosure, as illustrated in FIG. 2A, may include a transmitter 120 for irradiating light toward the vacuum chamber 200 and a receiver for receiving light reflected from the chamber 200, and the transmitter 120 and the receiver 110 may be disposed side by side on a front surface of the test substrate 100.

As an embodiment, the transmitter 120 and the receiver 110 may be an LED and a time of flight (TOF) sensor, and the claims of the present disclosure include all sensors capable of measuring a distance, and it is not limited by the exemplary embodiment.

According to an embodiment of the present disclosure, the test substrate 100 on which the distance measuring sensors 110 and 120 are disposed may be moved in X, Y, and Z axes by the robot arm 310, or may be moved by adjusting a direction on a plane by being moved by an angle θ at a R distance in X, Y, and Z planes, and may be moved by separately adjusting a vertical direction of the Z axis.

Conventionally, it was easy to control the X, Y-axis, or R, θ in a horizontal direction by imaging the test substrate 100 from upwardly to downwardly, but when the test substrate 100 enters the vacuum chamber 200, the test substrate 100 may no longer be photographed, so it is not easy to correct a position thereof in the Z-axis direction.

Therefore, according to an embodiment of the present disclosure, by installing the distance measuring sensors 110 and 120 in a front portion of the test substrate 100 entering the vacuum chamber 200, before entering the vacuum chamber 200 as well as entering the vacuum chamber 200, it is possible to measure the distance by the distance measuring sensors 110 and 120 and control the position therethrough, so that auto-teaching in the Z-axis direction may be performed.

Thereby, before entering the vacuum chamber 200, an external structure such as a slit valve 230 of the vacuum chamber 200 was sensed to avoid the external structure and auto-teaching into an accessible Z-axis space may be performed, and an internal structure such as an electrostatic chuck 220 or a lower support 210 of the vacuum chamber 200 was detected to avoid the internal structure and auto-teaching into a space in which the wafer W can be mounted may be performed.

In addition, when the test substrate 100 moves and a structure of the vacuum chamber 200 changes while performing the process, there may be a case of restarting position adjustment of the Z-axis of the test substrate 100 from the beginning, and according to an embodiment of the present disclosure, even when the test substrate 100 is outside of a reference position for a long period of time, an accessible Z-axis region may be easily determined through the distance measuring sensors 110 and 120 installed in the front portion of the test substrate 100.

In addition, in a closed dark state without opening the vacuum chamber 200, Z-axis position correction may be performed without a separate imaging apparatus or image processing, so that work efficiency can be increased.

On the other hand, as illustrated in FIG. 2B, the test substrate 100 may transmit information on reflected light, irradiated from the transmitter 120 and received in the receiver 110 to a control unit 400 through the transceiver 130, and the measurement result, measured at this time, may be stored in a memory 140. As an embodiment, the memory 140 may be a volatile memory to receive the repeated measurement results of the distance measuring sensors 110 and 120.

The control unit 400 according to an embodiment of the present disclosure may include a position control unit 410, a setting control unit 420, and an information storage unit 430, the position control unit 410 may compare the distance threshold information in the first direction among the processing apparatus-related information with the measurement result of the distance measuring sensor, to determine a height of substrate-accessible region in a second direction of the processing apparatus corresponding to the distance threshold value, the setting control unit 420 automatically teaches the robot arm 310 in consideration of the height of the processing apparatus in the second direction and a current position of the test substrate 100, so that setting may be performed so that the test substrate 100 moves to the substrate entry height, and the information storage unit 430 may receive and store processing device-related information such as distance threshold information, or the like in advance.

Here, the processing device-related information may be vacuum chamber-related information according to an embodiment of the present disclosure.

Specifically, as illustrated in FIG. 1, in the information storage unit 430, a length (A) from the test substrate 100 at a reference point to one surface over an electrostatic chuck 200, a length (B) of the electrostatic chuck 220, a length (C) of the vacuum chamber 200, and a length (D) from the test substrate 100 at a reference point to an upper surface over the slit valve 230 may be stored.

For example, the A may be stored as 284 mm, the B may be stored as 300 mm, the C may be stored as 568 mm, and the D may be stored as 150 mm, and a distance threshold range of the vacuum chamber-related information may be predetermined as a predetermined error range. Specific numerical values of A to D may vary.

According to a structure of the vacuum chamber 200, predetermined numerical values of A to D may be input to a position control unit 410, and the position control unit 410 may determine point position ranges of C1, C2, and C3 according to the predetermined numerical values, so that a first threshold value, a second threshold value, and a third threshold value can be determined, and may determine whether the test substrate 100 is in a region in the Z-axis, that the test substrate 100 may enter the vacuum chamber 200 by comparing the measurement result measured by the distance measuring sensors 110 and 120 with the first threshold value, the second threshold value, and the third threshold value.

For example, when a range of C is in 563 mm to 573 mm with an error range of 5 mm, the range of C is determined as a distance threshold value, and a measurement result by the distance measuring sensors 110 and 120 is in the threshold range, it can be seen that the test substrate 100 is disposed at a height corresponding to an empty space above the electrostatic chuck 220. Therethrough, it is possible to determine whether the test substrate 100 is in a Z-axis region capable of entering the vacuum chamber 200, and to determine entry thereof into the vacuum chamber 200.

Accordingly, the position control unit 410 according to an embodiment of the present disclosure may compare distance threshold information stored in the information storage unit 430 with the measurement result of the distance measuring sensors 110 and 120 to calculate a height of the vacuum chamber 200 corresponding to the distance threshold value, and to calculate a substrate entry height with respect to the test substrate 100 corresponding to a height of the processing apparatus.

Then, by setting driving information of the robot arm 310 so that the test substrate 100 moves to the calculated substrate entry height, the setting control unit 420 may teach the test substrate 100.

Meanwhile, the transfer robot 300 according to an embodiment of the present disclosure may include a robot arm 310 connected to one side thereof, and can transfer the test substrate 100 through the robot arm 310.

The transfer robot 300 may rotate or be driven in a vertical direction (Z-axis), and may move the test substrate 100 in a Y-axis direction through the connected robot arm 310.

Figure 3:
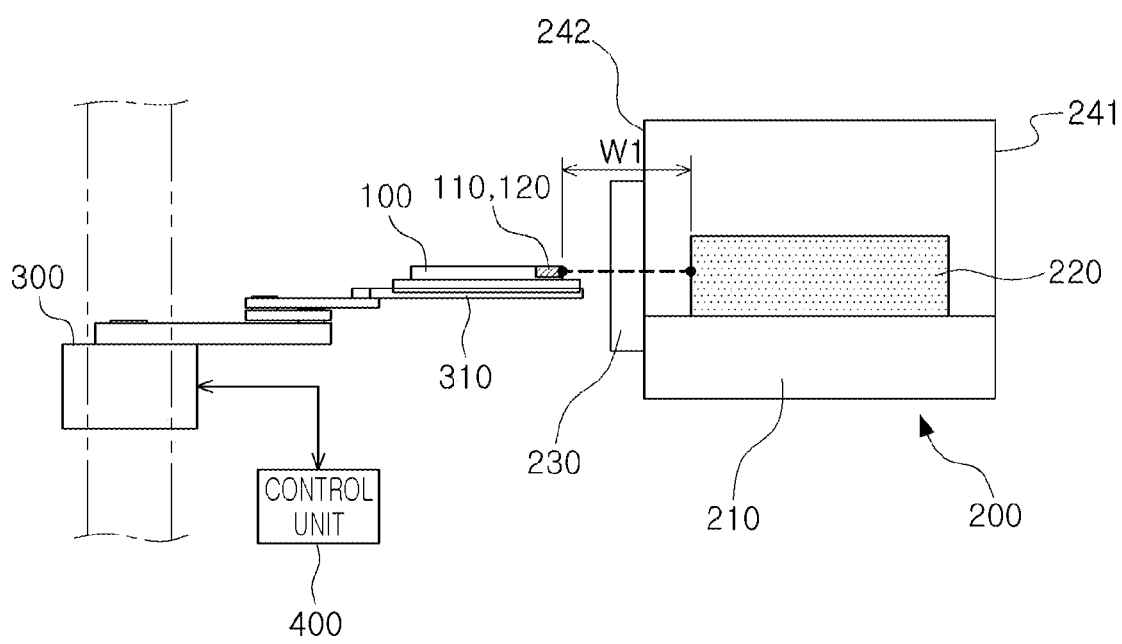
FIG. 3 is a diagram illustrating a control process of a substrate processing apparatus including a test substrate using a distance measuring sensor according to an embodiment of the present disclosure.
Figure 4:
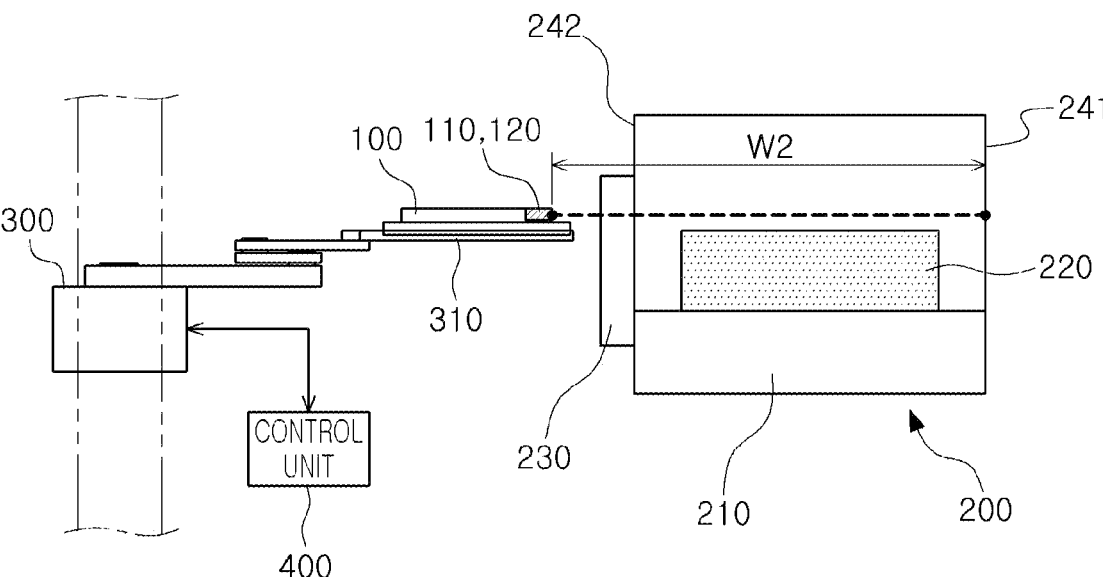
FIG. 4 is a diagram illustrating a control process of a substrate processing apparatus including a test substrate using a distance measuring sensor according to an embodiment of the present disclosure.
Figure 5:
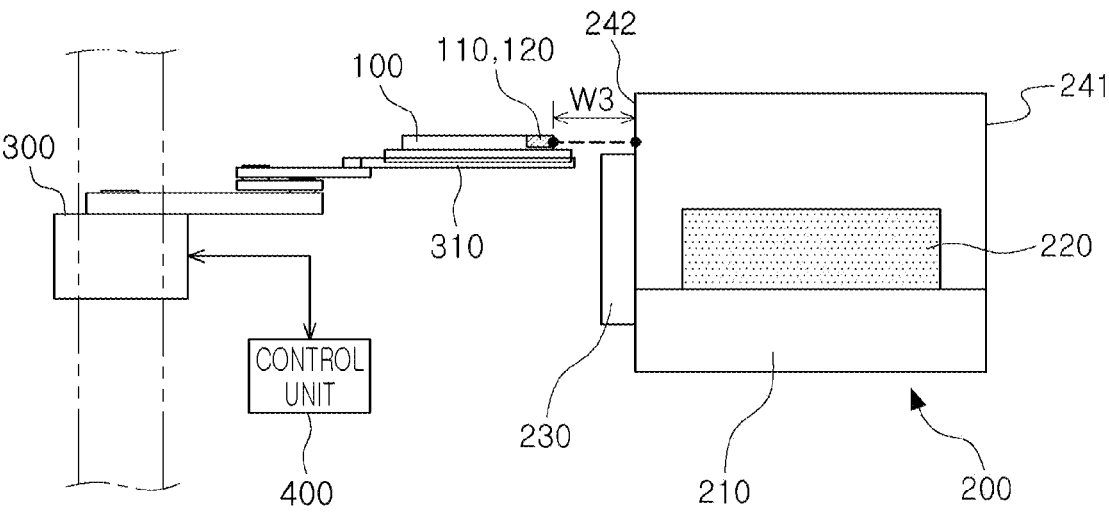
FIG. 5 is a diagram illustrating a control process of a substrate processing apparatus including a test substrate using a distance measuring sensor according to an embodiment of the present disclosure.
Figure 6:
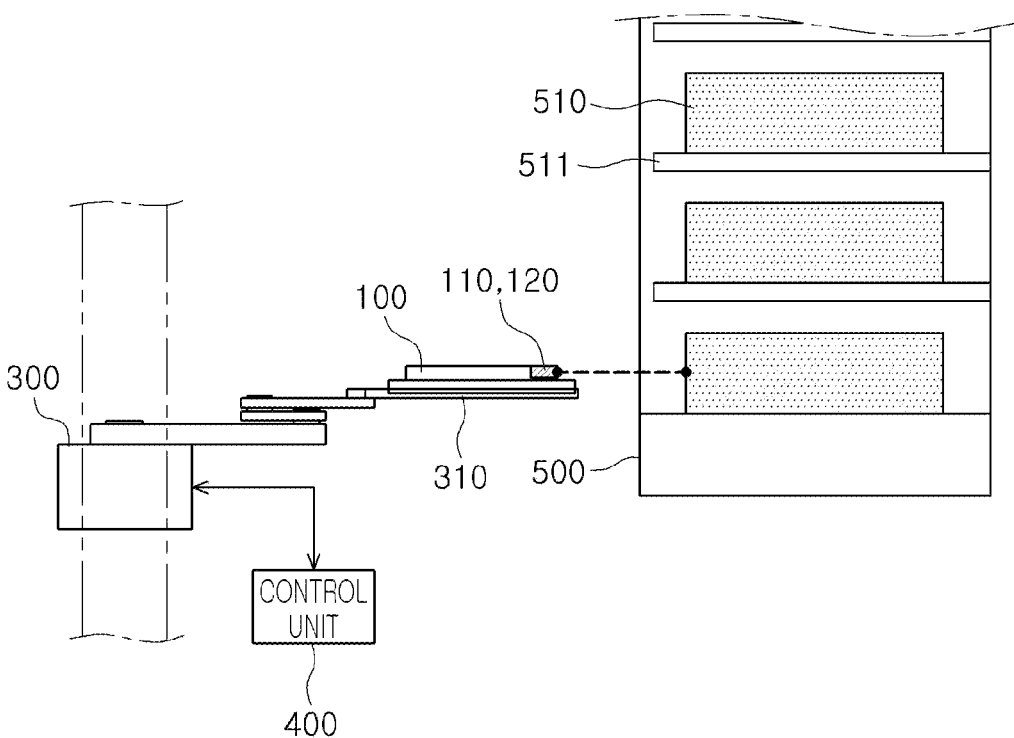
FIG. 6 is a side view of a substrate processing apparatus including a test substrate using a distance measuring sensor according to another embodiment of the present disclosure.
Figure 7:
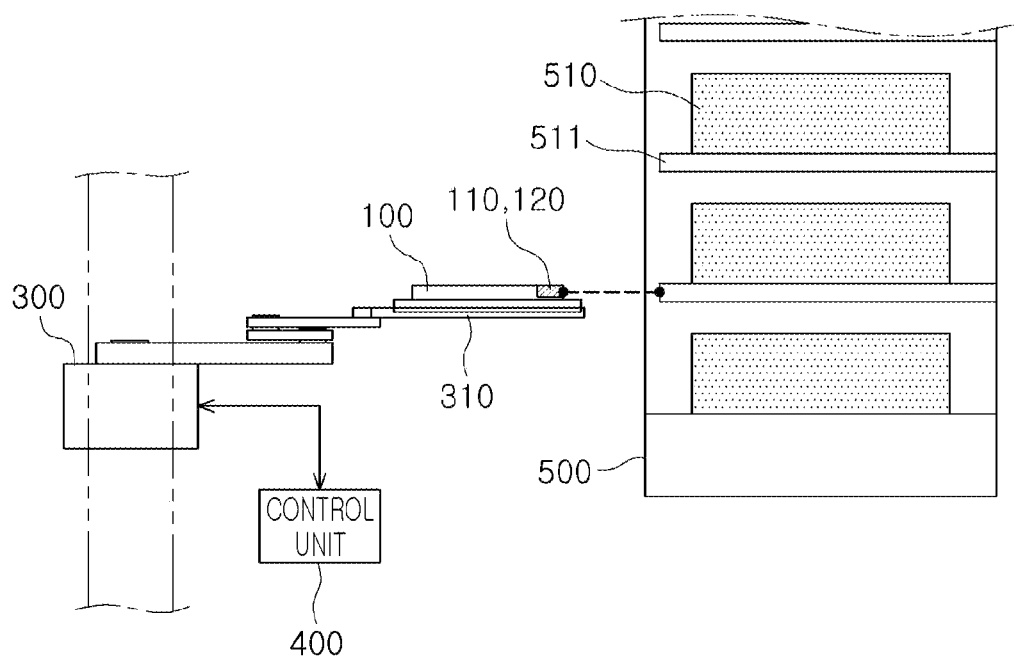
FIG. 7 is a diagram illustrating a control process of a substrate processing apparatus including a test substrate using a distance measuring sensor according to another embodiment of the present disclosure.
Figure 8:
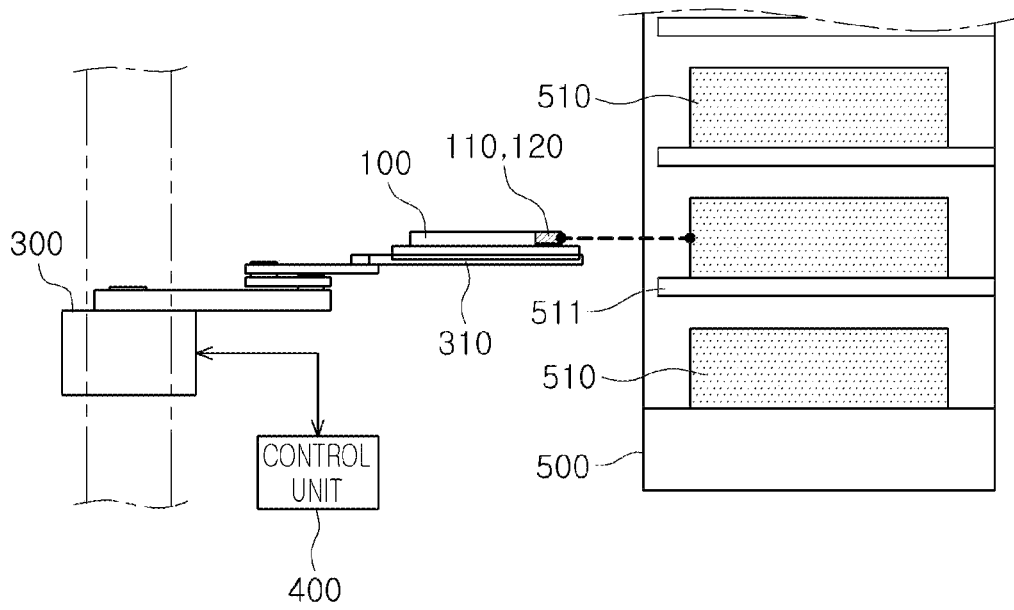
FIG. 8 is a diagram illustrating a control process of a substrate processing apparatus including a test substrate using a distance measuring sensor according to another embodiment of the present disclosure.

Hereinafter, a detailed control process of the substrate processing apparatus including the test substrate 100 using the distance measuring sensors 110 and 120 according to an embodiment of the present disclosure will be described. FIGS. 3 to 5 illustrate semiconductor manufacturing facilities according to a first embodiment, and FIGS. 6 to 8 illustrate semiconductor manufacturing facilities according to a second embodiment.

First Embodiment

According to an embodiment of the present disclosure, a transfer robot 300 including a robot arm 310; a vacuum chamber 200 having a stage on which a substrate is mounted by the transfer robot 300; a test substrate 100 connected to the robot arm 310 and entering the vacuum chamber 200 in a predetermined first direction (Y-axis); distance measuring sensors 110 and 120 connected to the test substrate 100 and measuring a distance from the vacuum chamber 200 in the first direction; a position control unit 410 calculating a substrate entry height for entry thereof into the vacuum chamber 200 based on the predetermined vacuum chamber-related information and measurement results of the distance measuring sensors 110 and 120; and a setting control unit 420 setting the test substrate 100 to move to the substrate entry height.

Here, the setting control unit 420 may set driving data of the robot arm 310 so that the test substrate 100 moves into a substrate-accessible region.

Specifically, the position control unit 410 according to an embodiment of the present disclosure may receive the measurement results of the distance measuring sensors 110 and 120 measured at a plurality of heights, and may compare the distance threshold information among the vacuum chamber-related information with the measurement results of the distance measurement sensors 110 and 120, to calculate a height of the vacuum chamber 200 corresponding to the distance threshold value and a substrate entry height with respect to the test substrate 100 corresponding to the height of the vacuum chamber 200.

For example, as illustrated in FIG. 3, when a measured value W1 of the distance measuring sensors 110 and 120 is within a predetermined first threshold value, the position control unit 410 may determine that it is in a Z-axis region in which the test substrate 100 may not enter, and control so that the robot arm 310 raises the test substrate 100.

In this case, the first threshold range may be a distance range from the test substrate 100 to one side of the ESC 220 in the chamber 200.

Specifically, as illustrated in FIG. 3, when a distance W1 measured by the distance measuring sensors 110 and 120 is within a first threshold value, in which a distance range from the test substrate 100 to one side of an ESC 200 according to A to D is calculated, the position control unit 410 may determine that it is in a Z-axis region in which the current test substrate 100 may not enter, when the test substrate 100 enters as it is so that it collides with the ESC 220.

Accordingly, the position control unit 410 may give an ascend command to the robot arm 310 to position the test substrate 100 above one side surface of the ESC 220, when a measurement result by the distance measuring sensors 110 and 120 is outside of a first threshold value to enter a second threshold value corresponding to the Z-axis region that can be entered, the movement may be completed, and the robot arm 310 may perform entry of the test substrate 100 into the chamber 200.

As an embodiment, when the robot arm 310 slowly raises from a driving reference point at which driving of the robot arm 310 starts so that the measured value of the distance measuring sensors 110 and 120 is within a range of the first threshold value, the robot arm 310 may be moved as much as a height of the ESC 220 to perform entry thereof into the chamber 200 from then on.

Alternatively, as illustrated in FIG. 4, according to an embodiment of the present disclosure, when the measured value of the distance measuring sensors 110 and 120 is within a second threshold value, the position control unit 410 may determine it is in a Z-axis region in which the test substrate 100 may enter, and may control the robot arm 310 to move the test substrate 100 into the vacuum chamber 200 in a first direction (Y-axis).

In this case, the second threshold range may be a distance range from the test substrate 100 to a first sidewall 241, a chamber wall surface, located on an opposite side of the test substrate 100.

Specifically, as illustrated in FIG. 4, when a distance W2 measured by the distance measuring sensors 110 and 120 is within a second threshold value in which a distance range from the test substrate 100 to a first sidewall 241 of the chamber is calculated according to predetermined A to D, the position control unit 410 may be mounted on the ESC 220 without colliding with an internal configuration of the chamber 200 when the test substrate 100 enters as it is, so that the position control unit 410 may determine that it is in a Z-axis region in which the test substrate 100 may enter.

Accordingly, the position control unit 410 does not give a separate ascend or descend command to the robot arm 310, and the robot arm 310 may perform the entry of the test substrate 100 into the chamber 200 as it is at its current position.

In addition, as illustrated in FIG. 5, when the measured values of the distance measuring sensors 110 and 120 are within a predetermined third threshold range, the position control unit 410 according to an embodiment of the present disclosure may determine that it is in a Z-axis region in which the test substrate 100 may not enter, and may control that the robot arm 310 to lower the test substrate 100.

In this case, the third threshold range C3 may be a distance range from the test substrate 100 to an upper surface over a slit valve 230 outside of the chamber 200.

Specifically, as illustrated in FIG. 5, when a distance W3 measured by the distance measuring sensors 110 and 120 is within a third threshold value in which a distance range from the test substrate 100 to an upper surface of an external slit valve 230 according to predetermined A to D is calculated, when the test substrate 100 enters as it is, it collides with an outer wall of the vacuum chamber 200, the position control unit 410 may determine that it is in a Z-axis region in which the test substrate 100 may not currently enter.

Accordingly, the position control unit 410 may give a descend command to the robot arm 310 to position the test substrate 100 below an top surface of the slit valve 230, that is, at a height at which the slit valve 230 is located, and when a range of the threshold value to which W3 belongs is changed and the movement of the position is completed, the robot arm 310 may perform the entry of the test substrate 100 into the vacuum chamber 200.

As an embodiment, the position control unit 410 may perform the entry of the test substrate 100 into the vacuum chamber 200 by slowly raising the robot arm 310 from a driving reference point at which driving of the robot arm 310 starts, or in the case the test substrate 100 is driven to start from above the slit valve 230 due to a change in a structure of the vacuum chamber 200, or the like, the position control unit 410 may perform the entry of the test substrate 100 into the vacuum chamber 200 when the measured value W3 of the distance measuring sensors 110 and 120 is within a range of the second threshold value by slowly lowering the robot arm 310.

Accordingly, a value for an internal structure or an external structure inside or outside of the vacuum chamber 200 may be predetermined in the information storage unit 430, and accordingly, a distance threshold value in a Y-axis direction derived accordingly, may be compared with measurement results of the distance measuring sensors 110 and 120 so that a substrate entry height of the test substrate 100 in a Z-axis direction so that the entry of the test substrate 100 may be auto-taught.

That is, in the information storage unit 430, processing apparatus-related information including the presence and absence and length information of an internal structure or an external structure in the processing apparatus, for example, in the vacuum chamber 200, and distance threshold information in the first direction calculated accordingly may be pre-stored, or the information may be input to the memory 140 through the transceiver 130. The information storage unit 430 may be mounted in the test substrate 100, or may be disposed outside the test substrate 100 to communicate with the test substrate 100.

Finally, as illustrated in FIGS. 3 to 5, when a Z-axis position control process is completed, it is determined to be within a Z-axis region in which the test substrate 100 may enter, and the robot arm 310 may move the test substrate 100 into the vacuum chamber 200 in a predetermined first direction.

Therefore, in a situation in which it is difficult to know a position of the test substrate 100 in a Z-axis direction in a sealed chamber 200, the test substrate 100 may be moved in the Z-axis direction so that the test substrate 100 may enter from any position of the test substrate 100, the position of the test substrate 100 may be controlled.

Since it is unnecessary to install a separate sensor unit in the vacuum chamber 200, and a substrate entry position in a Z-axis using Y-axis data obtained by the distance measuring sensors 110 and 120 installed on the test substrate 100 may be obtained, a structure thereof may be simple and work efficiency may be improved.

Alternatively, according to an embodiment of the present disclosure, when a measurement result measured by the distance measuring sensors 110 and 120 is output below a predetermined lower limit value and the test substrate 100 fails to enter the processing apparatus, for a specific example, if a distance between the test substrate 100 and the processing apparatus, which the distance measuring sensors 110 and 120 measure in real time, is close to 0, it can be seen if it enters any further, a collision with the structure of the processing apparatus occurs.

In this case, the setting control unit 420 may control the robot arm 310 to return to a reference point at which the robot arm 310 starts driving, and the reference point may be a position corresponding to a bottom surface or a ceiling surface of a region capable of entering the processing apparatus.

Therefore, the test substrate 100, connected to the robot arm 310, may perform a scan in a Z-axis direction from a bottom surface or a ceiling surface by being returned to the bottom surface or the ceiling surface to perform a scan again, and a distance in a first direction may be measured and auto-teaching can be performed again.

Then, when the distance measuring sensors 110 and 120 do not collide with a processing apparatus and enter the processing apparatus by a distance in the first direction corresponding to the measured measurement result, it may detect that the entry of the test substrate 100 thereinto is completed and centering may be performed so that the test substrate 100 is positioned at a center in a processing region.

Specifically, according to an embodiment of the present disclosure, a camera installed below the test substrate 100 may be further included, and the camera may drive the robot arm 310 according to an image captured by the camera so that the test substrate 100 is positioned at a target position in the processing apparatus. A lighting apparatus may be additionally installed on one side of the camera to perform image processing through the camera inside the processing apparatus.

Meanwhile, according to another embodiment of the present disclosure, the test substrate 100 may be connected to the robot arm 310 may be moved in a third direction (X-axis), which is a horizontal direction perpendicular to the first direction (Y-axis), the distance measuring sensors 110 and 120 may scan the processing apparatus, for example, the vacuum chamber 200 in a predetermined third direction (X-axis), and measure a distance with the processing apparatus in the first direction (Y-axis), and the position control unit 410 may further determine a region capable of entering the substrate into the processing apparatus in the third direction (X-axis) based on the processing apparatus-related information and the measurement results of the distance measuring sensors 110 and 120.

That is, the substrate-accessible region in a third direction may mean a position in the substrate entry width direction in the third direction.

Since the robot arm 310 may also be moved in a X-axis, a distance threshold value may be predetermined in consideration of an internal structure and an external structure of the vacuum chamber 200 in the X-axis direction, and accordingly, the robot arm 310 may be driven in the X-axis direction), a plurality of measurement results obtained from the distance measuring sensors 110 and 120 may be compared with a distance threshold value. Thereby, the position control unit 410 may further calculate a position in a substrate entry width direction to which the robot arm 310 should move, and the setting control unit 420 may further set the test substrate 100 in a third direction (X-axis) so that the test substrate 100 moves to the position in the substrate entry width direction.

That is, according to another embodiment of the present disclosure, the position control unit 410 may calculate an entry position of the test substrate 100 in a width direction between a front portion and a rear portion of the vacuum chamber 200 by using the measured value of the distance measuring sensors 110 and 120, the setting control unit 420 may set a position of the test substrate 100 to an entry position in a width direction at which the test substrate 100 may enter the chamber 200, and the robot arm 310 may move the test substrate 100 in a third direction (X-axis) according to a setting.

In this case, the front and rear portions of the chamber 200 refer to surfaces excluding the first sidewall 241 and the second sidewall 242.

Since not only Z-axis auto-teaching but also X-axis auto-teaching can be performed through one of the distance measuring sensors 110 and 120, entry thereof into the vision test substrate 100 can be efficiently performed.

In the above-described embodiment, although it is illustrated to be limited to the vacuum chamber 200, this is merely an exemplary embodiment, and the present disclosure may also be applied to other processing apparatuses in consideration of processing apparatus-related information.

Second Embodiment

According to another embodiment of the present disclosure, a test substrate 100 may be automatically taught with respect to a processing apparatus 500 including a plurality of stages 510 into which a plurality of wafers W can enter.

As illustrated in FIG. 6, according to another embodiment of the present disclosure, a substrate processing apparatus including a test substrate 100 using distance measuring sensors 110 and 120 may include: a transfer robot 300 including a robot arm 310; a processing apparatus 500 including a plurality of stages 510 accommodating a plurality of test substrates 100; a test substrate 100 connected to the robot arm and entering the processing apparatus 500 in a predetermined first direction; distance measuring sensors 110 and 120 connected to the test substrate 100 and measuring a distance from the processing device 500 in the first direction; and a position control unit 410 calculating an entry height of the substrate into the processing device 500 based on predetermined processing apparatus-related information and measurement results of the distance measuring sensors 110 and 120.

As an embodiment, the distance measuring sensors 110 and 120 may be an LED and a Time of Flight (TOF) sensor disposed side by side on a front portion of the robot arm 310. Redundant contents thereof are omitted for clarity of description.

As illustrated in FIG. 6, the substrate processing apparatus including the test substrate 100 according to an embodiment of the present disclosure may also be applied to a processing apparatus 500 in which stages 510 partitioned at regular intervals are formed to accommodate a plurality of test substrates 100.

Specifically, as illustrated in FIG. 7, when measured values of the distance measuring sensors 110 and 120 are within a predetermined fourth threshold range, the position control unit 410 may determine that it is in a Z-axis region that the test substrate 100 may not enter, and may control the robot arm 310 to raise the wafer.

In this case, the fourth threshold range may be a distance range from the robot arm 310 to a protruding vertical surface 511 of the stage 510 in the processing apparatus 500.

Specifically, as illustrated in FIG. 7, the processing apparatus 500 includes a stage 510 capable of accommodating the test substrate 100 at regular intervals and a protruding vertical surface 511 being divided by partitioning each of the stages 510, the protruding vertical surface 511 being a region into which the test substrate 100 may not enter.

Therefore, when a measurement result measured by the distance measuring sensors 110 and 120 is within a distance threshold value from the robot arm 310 or the test substrate 100 installed on the robot arm 310 to the protruding vertical surface 400, the position control unit 410 may lower or raise the robot arm 310 to move the same to the stage 510 in which the test substrate 100 may enter.

Alternatively, when the test substrate 100 is already accommodated in one stage 510, the measurement result measured by the distance measuring sensors 110 and 120 is within a fourth threshold range even in the region where the stage 510 is located. In this case, the robot arm 310 may move the test substrate 100 to the other stage 510.

Alternatively, as illustrated in FIG. 8, when the measurement value measured by the distance measuring sensors 110 and 120 is within a predetermined fifth threshold range, the position control unit according to another embodiment of the present disclosure may determine that it is in a Z-axis region in which the test substrate 100 may enter, and control the robot arm 310 to move the test substrate 100 to the stage 510 in a wafer accommodation direction.

In this case, the fifth threshold range may be a distance range from the robot arm 310 to the stage 510.

Specifically, as illustrated in FIG. 8, when the measured value measured by the distance measuring sensors 110 and 120 is within a distance range from the robot arm 310 or the test substrate 100 installed on the robot arm 310 to the stage 510 or an inner wall surface of the processing apparatus 500, the position control unit may perform entry thereof as it is without moving a position of the robot arm 310.

Therefore, even in a structure in which a plurality of stages 510 into which the test substrate 100 may enter is provided in one structure, such as a processing apparatus 500, instead of in a form of the vacuum chamber 200, Z-axis position adjustment can be performed, and thereby, it is possible to increase work efficiency by automatically controlling entry thereof into the test substrate 100 without a separate user's manual control.

FIG. 9 is a flowchart illustrating an auto-teaching method using a distance measuring sensor according to an embodiment of the present disclosure.

The auto-teaching method according to an embodiment of the present disclosure may be performed using a robot arm 310 for transferring the test substrate 100 having the distance measuring sensors 110 and 120 installed on a front surface thereof.

As illustrated in FIG. 9, according to an embodiment of the present disclosure, the method may include a distance measuring operation (S910) in which the distance measuring sensors 110 and 120 scan the processing device in a predetermined second direction and measure a distance from the test substrate 100 to a processing apparatus 500 in a predetermined first direction; a height calculation operation (S920) of determining a region in which the substrate can enter the processing apparatus 500 in the second direction to the processing device 500 in the second direction, based on a measurement result of the distance measuring sensors 110 and 120 and predetermined processing apparatus-related information; and a setting operation (S930) of setting driving data of the robot arm so that the test substrate 100 moves into the substrate-accessible region.

In this case, the substrate-accessible region may mean a height in which the substrate may enter in a Z-axis direction.

When the setting in S930 is completed, a test entry operation (S940) of entering the test substrate 100 into the processing apparatus 500 in a first direction (Y-axis) by the robot arm 310 may be included.

According to an embodiment of the present disclosure, the height calculation operation (S920) may include: an operation of comparing distance threshold information in the first direction, among the processing apparatus-related information with a measurement result of the distance measuring sensors 110 and 120; and an operation of determining a second direction of a substrate-accessible region of the processing apparatus 500 corresponding to the distance threshold value, and performing auto-teaching the robot arm in consideration of a height of the processing apparatus 500 in the second direction and a current position of the test substrate 100.

That is, by comparing a distance threshold value with measurement results of the distance measuring sensors 110 and 120, a substrate entry height in a vertical direction may be calculated, and teaching may be performed in a Z-axis region in which the substrate may enter.

In addition, according to another embodiment of the present disclosure, an operation of moving the test substrate 100 in a third direction (X-axis), which is a horizontal direction, perpendicular to the first direction connected to the robot arm 310 and scanning the processing apparatus, and measuring a distance from the processing apparatus in a predetermined third direction (X-axis); and an operation of calculating a position in a width direction of further determining a substrate-accessible region of the processing apparatus 500 in the third direction may be further included.

In addition, in the setting operation (S930), setting for driving data of the robot arm 310 in a third direction may be further performed so that the test substrate 100 moves from a current position to a substrate-accessible region in the third direction.

It is possible to perform teaching not only in the vertical direction but also in the third direction by using the distance measuring sensors 110 and 120 without additionally installing a separate sensor, so that the structure is simple and work efficiency can be improved.

According to an embodiment of the present disclosure, in the distance measurement operation (S910), light is irradiated toward the processing apparatus 500 by a receiver 110 disposed side by side on a front surface of the test substrate 100, and light reflected by the processing apparatus 500 may be received to measure a distance from the processing apparatus 500 for the test substrate 100.

Meanwhile, according to an embodiment of the present disclosure, in the setting operation (S930), a transfer operation of transferring the driving data of the robot arm 310 set in consideration of a substrate-accessible region, determined by the position control unit 410 and a current position of the test substrate 100 to the robot arm 310 and a wafer entry setting operation of setting the driving data of the robot arm 310 as a reference point of the robot arm 310 for entering the wafer W into the processing apparatus 500 may be further included.

When setting of an entry position of the robot arm 310 in the test substrate 100 is completed, the wafer W may be efficiently entered without wasting time for an initial entry by using the corresponding driving data as a reference point when the wafer W is entered thereafter.

In addition, according to an embodiment of the present disclosure, the distance measuring operation (S910) may further include a scanning operation in which the robot arm 310 is driven in a second direction, i.e., a height direction, from a reference point corresponding to a bottom surface or a ceiling surface of the processing apparatus 500 and performing a scan on the processing apparatus 500. In the scanning operation, when a measurement result measured by the distance measuring sensors 110 and 120 corresponds to a distance threshold value of a substrate-accessible region in which the test substrate 100 may enter the processing apparatus 500, the position control unit 410 may end a scan.

By scanning an entire Z-axis region, a correct substrate entry height) may be calculated so that work efficiency of auto-teaching may be improved through accurate setting. Contents overlapping with the above will be omitted for clarity of description.

In addition, it is possible to provide a recording medium storing a program for performing the above-described method, and in the height calculation operation and the setting operation disclosed in the above-described auto-teaching method are produced as a program to be executed on a computer and may be stored in a computer-readable recording medium. Examples of the computer-readable recording medium include ROM, RAM, CD-ROM, magnetic tape, floppy disk, optical data storage device, and the like. In addition, the computer-readable recording medium may be distributed in a computer system connected through a network, so that a computer-readable code can be stored and executed in a distributed manner. A functional program, code, and code segments for implementing the method can be easily inferred by programmers in the art to which the present disclosure pertains.

In addition, in describing the present disclosure, the 'position control unit' may be implemented by various methods, for example, a processor, program instructions executed by the processor, a software module, a microcode, a computer program product, a logic circuit, an application-specific integrated circuit, firmware, and the like.

As set forth above, according to an embodiment of the present disclosure, it is possible to transport and insert a wafer to an accurate position without the need to install a separate apparatus even inside the processing apparatus that the user cannot visually determine. In addition, according to an embodiment of the present disclosure, when the wafer is transported to the inside, it does not affect an internal space of the processing apparatus, so that operation yield of the process is not reduced.

In addition, the substrate processing apparatus including the test substrate according to an embodiment of the present disclosure has a simple structure and is easy to be managed and has a low cost.

While this disclosure includes specific examples, it will be apparent to one of ordinary skill in the art that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed to have a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A substrate processing apparatus including a test substrate, comprising:
   a test substrate connected to a robot arm and entering a processing apparatus in a first predetermined direction;
   a distance measuring sensor embedded in a perimeter of the test substrate, and configured to measure a distance from the processing apparatus in the first predetermined direction while scanning the processing apparatus in a predetermined second direction; and
   a position control unit configured to determine a height of a substrate-accessible region in the second predetermined direction, based on predetermined processing apparatus-related information and a measuring result of the distance measuring sensor,
   wherein the position control unit compares the measured result to multiple predetermined threshold values among the processing apparatus-related information, and controls the robot arm to perform at least one of ascending, descending, or entering into the processing apparatus depending on which of the predetermined threshold values the measured result corresponds to.

2. The substrate processing apparatus including a test substrate of claim 1, further comprising:
   a setting control unit setting driving data of the robot arm so that the test substrate moves into the substrate-accessible region.

3. The substrate processing apparatus including a test substrate of claim 2,
   wherein the setting control unit automatically teaches the robot arm in consideration of the height of the processing apparatus in the second direction and a current position of the test substrate.

4. The substrate processing apparatus including a test substrate of claim 3, wherein the test substrate further comprises
   a volatile memory temporarily storing a measurement result of the distance measuring sensor; and a transceiver transmitting and receiving to and from the setting control unit.

5. The substrate processing apparatus including a test substrate of claim 4, further comprising:
   an information storage unit pre-storing processing apparatus-related information including information on existence and length information of an internal structure or an external structure in the processing apparatus and distance threshold information calculated accordingly, or inputting the information into the memory through the transceiver.

6. The substrate processing apparatus including a test substrate of claim 5, wherein, when a measured result measured by the distance measuring sensor is output below a predetermined lower limit value and the test substrate fails to enter a processing apparatus,
   the setting control unit controls the robot arm so that the robot arm is returned to a reference point at which the robot arm starts driving, the reference point being a position corresponding to a bottom surface or a ceiling surface of substrate-accessible region into the processing apparatus.

7. The substrate processing apparatus including a test substrate of claim 5, further comprising:

a camera installed below the test substrate, wherein, when entering the processing apparatus by a distance in a first direction corresponding to the measured result measured by the distance measuring sensor, the robot arm is driven according to an image captured by the camera so that the test substrate is placed at a target position in the processing apparatus.

8. The substrate processing apparatus including a test substrate of claim 1, wherein the test substrate is connected to the robot arm and moves in a third direction, a horizontal direction, perpendicular to the first direction, and the distance measuring sensor measures a distance from the processing apparatus in the first direction while scanning the processing apparatus in a predetermined third direction, wherein the position control unit further determines a substrate-accessible region into the processing apparatus in the third direction based on the processing apparatus-related information and the measurement result of the distance measuring sensor.

9. The substrate processing apparatus including a test substrate of claim 1, wherein the distance measuring sensor comprises a transmitter irradiating light toward the processing apparatus and a receiver receiving reflected light in which the light is reflected from the processing apparatus wherein the transmitter and the receiver are disposed side by side on a front surface of the test substrate.

10. The substrate processing apparatus including a test substrate of claim 9, wherein the transmitter comprises an LED, and the receiver includes a Time of Flight (TOF) sensor.

11. The substrate processing apparatus including a test substrate of claim 1, wherein the processing apparatus has a single sealed internal space, or comprises a plurality of sections of the same size, partitioned at regular intervals.

12. An auto-teaching method of a robot arm for transferring a test substrate having a distance measuring sensor embedded in a perimeter thereof, the auto-teaching method including:

scanning a processing apparatus in a predetermined second direction by the distance measuring sensor and measuring a distance from the test substrate to the processing apparatus in a predetermined first direction;

determining a a height of a substrate-accessible region of the processing apparatus in the predetermined second direction, based on a measured result of the distance measuring sensor and predetermined processing apparatus-related information; and performing setting driving data of the robot arm so that the test substrate moves into the substrate-accessible region, wherein the determining includes comparing the measured result to multiple predetermined threshold values among the processing apparatus-related information, and controlling the robot arm to perform at least one of ascending, descending, or entering into the processing apparatus depending on which of the predetermined threshold values the measured result corresponds to.

13. The auto-teaching method of claim 12, further comprising:

entering the test substrate into the processing apparatus in the predetermined first direction by a robot arm, when setting is completed.

14. The auto-teaching method of claim 12, wherein the determining further comprises:

determining a height of a substrate-accessible region into the processing apparatus in a predetermined second direction corresponding the predetermined threshold value according to the comparison result, and performing auto-teaching the robot arm in consideration of the height of the processing apparatus in the predetemined second direction and a current position of the test substrate.

15. The auto-teaching method of claim 12, further comprising:

scanning the processing apparatus while moving the test substrate connected to the robot arm in a third direction, a horizontal direction, perpendicular to the predetermined first direction, and measuring a distance from the processing apparatus in a predetermined third direction; and further determining a substrate-accessible region in which the substrate can enter the processing apparatus in the predetermined third direction based on the processing apparatus-related information and a measured result of the distance measuring sensor, wherein the performing further performs setting of driving data of the robot arm in a third direction so that the test substrate moves from a current position to the substrate-accessible region in the third direction.

16. The auto-teaching method of claim 12, wherein, in the scanning, light is irradiated toward the processing apparatus by a transmitter, and light reflected by the processing apparatus is received by a receiver to measure a distance from the processing apparatus to the test substrate, wherein the transmitter and the receiver are disposed side by side on a front surface of the test substrate.

17. The auto-teaching method of claim 12, wherein the performing further comprises:

transmitting driving data of the robot arm set in consideration of a substrate-accessible region determined by a position control unit and a current position of the test substrate to the robot arm; and setting the driving data of the robot arm as a reference point of the robot arm for entering a wafer into the processing apparatus.

18. The auto-teaching method of claim 12, wherein the scanning further comprises driving the robot arm in the predetermined second direction from a reference point corresponding to a bottom surface or a ceiling surface of the processing apparatus and performing a scan on the processing apparatus.

19. The auto-teaching method of claim 18, wherein, in the driving, when the measured result measured by the distance measuring sensor corresponds to a distance threshold value of a substrate-accessible region in which the test substrate can enter the processing apparatus, the driving is terminated.

20. A recording medium storing a program for performing the method of claim 12.

* * * * *